US006208315B1

(12) United States Patent
Kenmochi

(10) Patent No.: US 6,208,315 B1
(45) Date of Patent: Mar. 27, 2001

(54) ANTENNA FOR RECEPTION OF SATELLITE BROADCAST

(75) Inventor: Akihisa Kenmochi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/436,230

(22) Filed: Nov. 9, 1999

(30) Foreign Application Priority Data

Nov. 10, 1998 (JP) ........................................ 10-319613

(51) Int. Cl.[7] ........................................ G01R 21/00
(52) U.S. Cl. .................... 343/894; 342/359; 33/270
(58) Field of Search .................... 343/894, 755, 343/760, 769; 33/268, 271, 1 DD, 1 CC, 270; 342/359, 357, 358

(56) References Cited

U.S. PATENT DOCUMENTS 4,159,576 * 7/1979 Campbell ........................ 33/281
4,454,658 * 6/1984 Lewis et al. .................... 33/268
4,956,920 * 9/1990 Kutz ............................ 33/268
5,760,739 * 6/1998 Pauli ........................... 342/359
5,808,583 * 9/1998 Roberts ......................... 342/359

* cited by examiner

*Primary Examiner*—Don Wong
*Assistant Examiner*—Ephrem Alemu
(74) *Attorney, Agent, or Firm*—McGuireWoods LLP

(57) ABSTRACT

An antenna for receiving a satellite broadcast can adjust orientation at higher precision than a method based on a compass and a level, without being influenced by environmental magnetic field generated by magnetic body or electromagnetic sources, can perform adjustment of orientation even before a radio wave from the satellite is not catched, can monitor the deviation during the fixation of the antenna orientation to improve the workability in adjustment of antenna orientation. The antenna for receiving a satellite broadcast has a reflector for reflecting a radio wave from a satellite on a reflecting surface for convergence and a receiving portion for receiving the radio wave reflected by the reflector. The antenna further includes a light blocking portion forming a shadow by the sun light, a scale determining a direction of the sun by the shadow formed by the light blocking portion. The light blocking portion and the scale are provided at an upper end portion of the reflector.

19 Claims, 8 Drawing Sheets

ANTENNA FOR RECEPTION OF SATELLITE BROADCAST

BACKGROUND OF THE INVENTION

1. Field of the Invention

The present invention relates generally to a satellite antenna or a satellite dish. More particularly, the invention relates to an antenna for receiving satellite broadcast, which provides easy and convenient installation.

2. Description of the Related Art

In order to receive a satellite broadcast program, the orientation of the satellite dish has to be adjusted for directing to a satellite accurately. Upon adjustment, since the radio wave from a broadcasting satellite (BS) is strong, sufficient signal intensity can be obtained even with a certain error in orientation. However, since the radio wave from a communication satellite (CS) is weak, it becomes impossible to obtain sufficient signal intensity unless the orientation of the antenna is correctly directed to the satellite. Various methods and systems for solving such problem have been developed and proposed. The conventional methods and systems are mainly based on the following two systems.

The first system adopts a method to adjust the orientation of the antenna by means of a compass and a level. The second system adopts a method for capturing a direction at which the intensity of received signal becomes at its available maximum.

The first system, namely the system employing the compass and the level, is characterized in simplicity. However, the north directed by the compass deviates about 6.5 degrees from the north of the earth's axis, which causes it difficult to adjust the orientation accurately within one degree of deviation. Furthermore, since the compass is influenced by environmental magnetic field, correct direction cannot be indicated if an antenna mount or a handrail of veranda are formed of magnetic body or the antenna is placed close to a domestic power source or a power cable. Particularly, in case of the antenna of the type, to which a direct current is supplied to a converter module, since a direct current magnetic field is generated quite close to the antenna and a compass, the influence of the magnetic field is significant. Due to the foregoing problems, the method employing the compass can not always enable us to adjust the satellite antenna orientation accurately.

The second system, namely the system employing signal intensity received by a satellite antenna, concerns the adjustment after the satellite antenna has caught the radio wave from the satellite. In case of the CS broadcasting, in which the radio wave is weak on the ground, difficulty is encountered in initially capturing the radio wave. Also, the orientation of the antenna often deviates from the direction with maximum reception intensity during the antenna fixation because fastening the antenna mounts on a mount pole changes the antenna direction somewhat. In the method employing the intensity of the received radio wave, difficulty is encountered to make judgment how much the orientation deviates and to keep the orientation during the fixation of the antenna.

SUMMARY OF THE INVENTION

It is therefore an object of the present invention to provide an antenna for satellite broadcast which enables us to adjust the orientation more precisely than the method based on a compass and a level, without being influenced by environmental magnetic field, and to adjust the orientation accurately even before the radio wave from the satellite is not caught. The present invention also enables us to fix the antenna kept in adjusted direction by monitoring the orientation so as not to deviate during fixing operation. The present invention improves of workability in adjustment of antenna orientation consequently.

In order to accomplish the above-mentioned and other objects, according to one aspect of the present invention, an antenna for satellite broadcast having a reflector for converging radio wave from a satellite and a receiver module for receiving the radio wave converged by the reflector, comprises:

a light blocking portion forming a shadow by the sun light;

a scale determining a direction of the sun by the shadow formed by the light blocking portion, the light blocking portion and the scale being provided at an upper end portion of the reflector.

As set forth above, by equipping the light blocking portion forming the shadow by the sun light and the scale for making judgment of the direction of the sun by the shadow formed by the light blocking portion, it becomes possible to direct the reflector toward the satellite utilizing the direction of the sun indicated by the shadow on the scale formed by the light blocking portion.

Also, according to the present invention set forth above, utilizing the direction of the sun, adjustment of orientation can be performed more precisely than the method using a compass and a level as not being influenced by the difference between the earth's axis and the geomagnetic axis, environmental magnetic field.

On the other hand, in accordance with the present invention, since the radio wave from the satellite is not used for adjustment, adjustment can be performed even when the radio wave from the satellite cannot be received as orientation of the antenna being not matched, when the receiving device is not present or when the receiving device cannot be connected upon installation of the antenna.

Furthermore, even during operation for fixing the antenna after adjustment, reference of orientation can be provided by the shadow formed by the light blocking portion and the scale. Therefore, the deviation from the adequate orientation can be monitored during the antenna fixation, which improves workability in adjustment of orientation of the antenna.

Therefore, according to the present invention, adjustment of the orientation of the satellite antenna can be performed simply and precisely.

In addition, since the light blocking portion and the scale are provided on the upper end portion of the reflector, the shadow formed by light blocking portion is not covered by the shadow of the reflector.

In the construction set forth above, the light blocking portion and the scale may be detachably mounted on the reflector.

Thus, since the light blocking portion and the scale are mounted detachably on the reflector, installation of the satellite antenna is performed in the condition where the light blocking portion and the scale are mounted on the reflector, and after completion of installation, the light blocking portion and the scale may be removed from the reflector.

Also, according to another aspect of the present invention, the satellite antenna having a reflector for converging radio wave from a satellite and a receiver module for receiving the radio wave converged by the reflector, comprises:

a light blocking portion forming a shadow by the sun light;

a scale determining a direction of the sun by the shadow formed by the light blocking portion, the light blocking portion and the scale being provided at an upper portion of the reflector.

Similarly to the former aspect of the invention, since the light blocking portion forming the shadow by the sun light and the scale for making judgment of the direction of the sun by the shadow formed by the light blocking portion, it becomes possible to direct the reflector toward the satellite utilizing the direction of the sun by making judgment of the direction of the sun with the shadow formed by the light blocking portion on the scale.

In the preferred construction, the light blocking portion and the scale are detachably mounted on the reflector.

The scale may be printed on the reflector. Since the scale is printed on the reflector, the scale portion attached on the reflector may be eliminated.

The light blocking portion may be adjustable of position with respect to the reflector. As set forth above, since the light blocking portion is adjustable of the position relative to the reflector, setting of the installation condition can be easily appreciated by adjusting the position of the light blocking portion. Also, the light blocking portion is adjustable of an angle with respect to the reflector. Since the light blocking portion is adjustable of angle relative to the reflector, setting of the installation condition can be easily appreciated by adjusting the angle of the light blocking portion.

The light blocking portion may form the shadow having a width corresponding to an elapsed time. The light blocking portion capable of forming the shadow variable of the width depending upon the elapsed time, is effective in the case required relatively long time in adjusting the antenna orientation.

The scale may be different according to the place where the antenna is installed. If the scale is different according to the place where the antenna is installed, the orientation of the antenna can be adjusted precisely in accordance with the place of installation.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only. In the drawings.

DESCRIPTION OF THE PREFERRED EMBODIMENT

Figure 1:
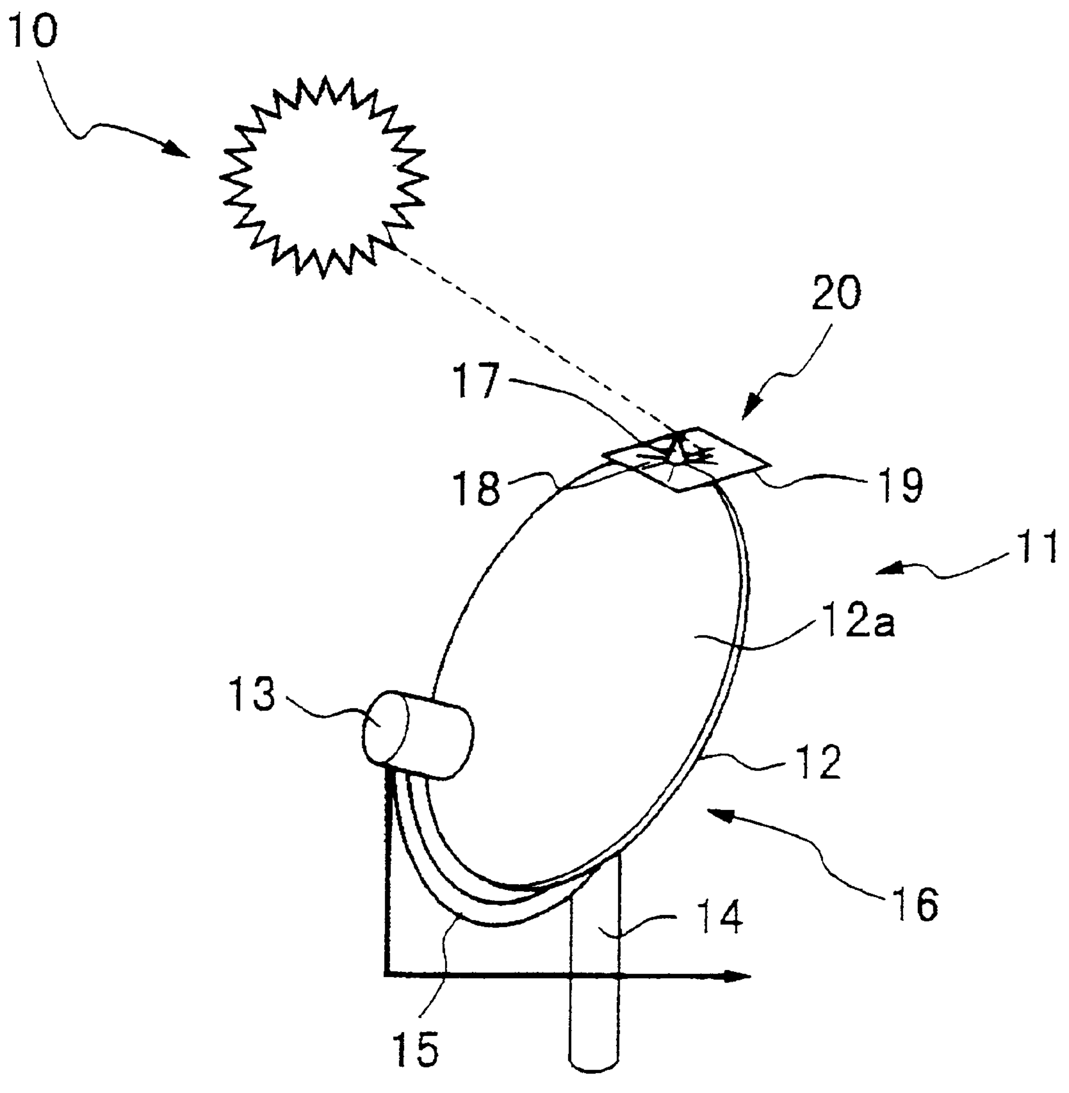
FIG. 1 is a perspective view showing the preferred embodiment of a satellite antenna according to the present invention.

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

The preferred embodiment of a satellite antenna or a satellite dish 11 includes a reflector 12 having a reflection surface 12*a* reflecting a radio wave from a satellite for convergence, a converter (receiving portion) 13 receiving the radio wave reflected by the reflection surface 12*a* of the reflector 12 at a converged position to output to a not shown receiver, a reflector support portion 14 supporting the reflector 12 and an antenna body 16 having a converter support portion 15 supporting the converter 13.

Furthermore, the satellite antenna 11 is provided with a solar clock portion 20 which includes a light blocking portion 17 which forms a shadow with the sun light 10 (in other words, forming a shadow indicative of direction) and a graduated circle 19 mounted the light blocking portion 17 at the center thereof and having a scale 18 for orientation reference in order to determine orientation of sun 10 based on the shadow formed by the light blocking portion 17. The solar clock portion 20 is detachably mounted on the upper end portion of the reflector 12 of the antenna body 16.

The satellite antenna 11 is designed for adjusting orientation of the antenna body 16 utilizing an orientation of the sun represented by the light blocking portion 17 and the scale 18 of the solar clock portion 20.

Next, discussion will be given for adjustment method of the satellite antenna 11 using the light blocking portion 17 and the scale 18 of the solar clock portion 20.

At first, the basic principle will be discussed.

The basic principle utilizes a principle of the solar clock.

Figure 2:
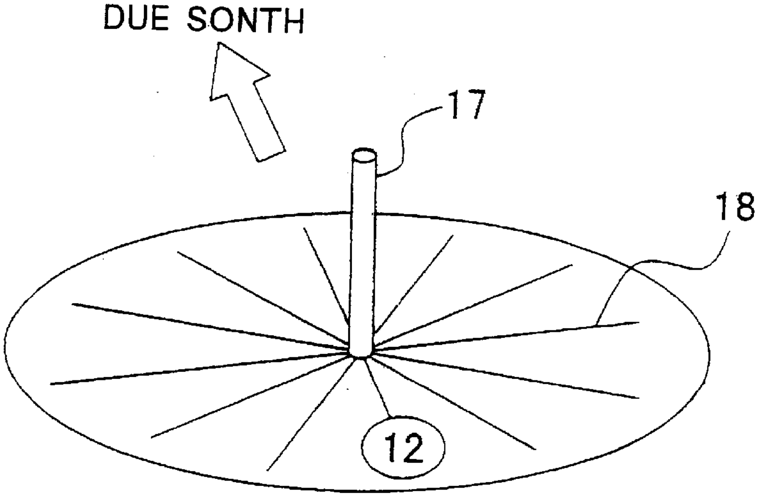
FIG. 2 is a perspective view showing a principle of solar clock to be employed in the preferred embodiment of a satellite antenna according to the present invention.

In general, a method to know a time using the solar clock is as follow:

(1) A time indicating surface of the solar clock is installed horizontally, and a direction of the sun at culmination or southing, namely a direction of the sun at midnoon is due south in the Northern Hemisphere, and is due north in the Southern Hemisphere (FIG. 2).

Figure 3:
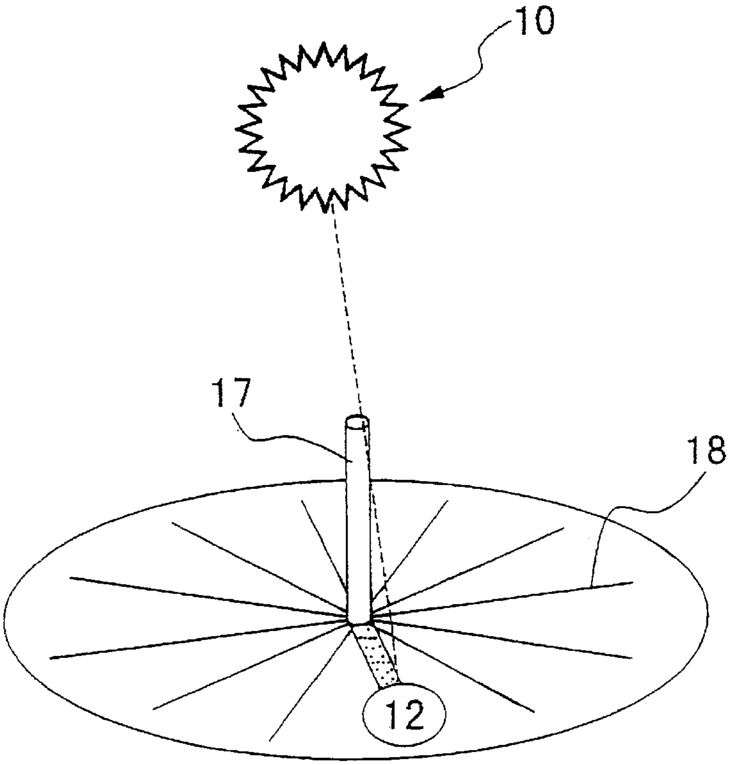
FIG. 3 is a perspective view showing a principle of solar clock to be employed in the preferred embodiment of a satellite antenna according to the present invention.

(2) The light blocking portion 17 is installed perpendicularly to the time indicating surface of the solar clock, namely, vertically, for reading a time on the scale 18 pointed by the shadow of the light blocking portion 17 (FIG. 3).

Using this principle, due south can be known by means of the solar clock once a difference of longitude between the place of the local standard time and the place of installation of the solar clock and an accurate local standard time are obtained.

The method is as follow.

It is assumed that the difference between the longitude L1 of the place of the local standard time and the longitude L2 of the place of installation of the solar clock is δ (degree). Namely, δ=L2−L1.

(A) A period Δt (time) corresponding to the difference of longitude δ is derived by the following equation.

$$\Delta t=\delta/15$$

(B) At the place where the solar clock is installed, the time indicating surface of the solar clock is installed horizontally, and the light blocking portion 17 is installed vertically, to take a direction opposite to the direction pointed by the light blocking portion 17 at t=12−Δt as due south.

For example, the longitude of the place of the local standard time in Japan is 135° east, at a point at longitude 138° east, δ=3° and δt=3/15=0.2 hour=12 minutes. Therefore, at the point of longitude 138° east, a direction opposite to the direction pointed by the shadow of the light blocking portion 17 at the local standard time 11:48 A.M. becomes due south. For culmination time of the sun 10, not only orbital motion of the earth but also a difference of orbital period, difference of period due to shifting of autorotation axis or so forth influence. Numerical values necessary for correction are shown in scientific table and the values in the scientific table may be used.

Using the foregoing method, the satellite antenna can be directed toward due south as follow.

(I) The solar clock portion 20 is installed on the antenna body 16.

Figure 4:
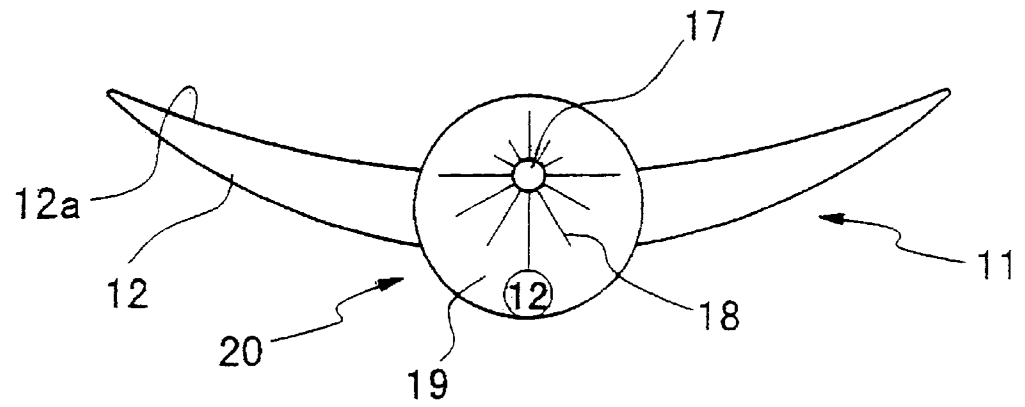
FIG. 4 is a plane view showing a condition where the preferred embodiment of the satellite antenna of the present invention is oriented toward due south.

(II) As shown in FIG. 4, the direction opposite to the direction of midnoon on the time indicating surface of the scale 18 of the solar clock portion 20 is matched with a direction of the reflection surface 12*a* of the reflector 12 of the antenna body 16 (hereinafter simply referred to as orientation of antenna).

(III) A time difference depending upon the difference of longitude between the place of the local standard time and the place of installation of the antenna 11 (hereinafter referred to as a time difference to be corrected).

(IV) The orientation of the antenna 11 is adjusted so that the solar clock time taking the time difference to be corrected, matches with the local standard time.

Figure 5:
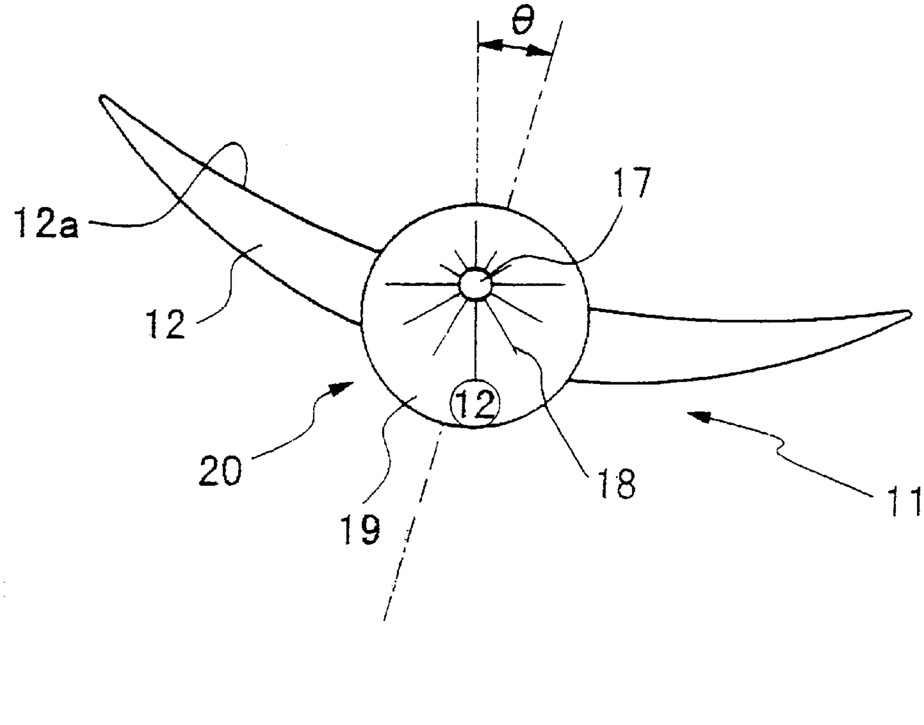
FIG. 5 is a plane view showing a condition where the preferred embodiment of the satellite antenna of the present invention is in a condition offset from the due south in a predetermined angle θ.

In the foregoing (II), by providing a given angular shift between the direction of the antenna 11 and the direction opposite to the midnoon of the solar clock portion 20 (FIG. 5), the antenna can be directed to the direction shifted for a given angle θ from the due south by adjusting the orientation of the antenna 11 to establish matching between the local standard time and the corrected solar clock time. For example, for installation of an antenna with dual LNB outputs receiving the broadcast from the satellites JCSAT-3 and JCSAT-4, in Tokyo, an azimuth angle of the satellite is 203° from due north in eastbound direction. Since the azimuth angle of the due south is 180°, θ in FIG. 5 is set at 23° to adjust the orientation of the antenna 11 for establishing matching of the local standard time and the corrected solar clock time.

As set forth above, since the light blocking portion 17 for forming shadow by sun light and the scale for determining the direction of sun 10 based on the shadow formed by the light blocking portion are provided on the reflector 12, the shadow formed by the light blocking portion 17 on the scale 18 is determined to orient the reflector 12 in the direction of satellite utilizing the direction of the sun 10.

Namely, by obtaining the solar clock time based on the direction of the sun, the corrected solar clock time can be easily derived corresponding to the longitude of the antenna installation place from the obtained solar clock time. Then, the azimuth angle of the satellite to direct the antenna 11 should be recited in a manual of the antenna, normally. An angular difference between the azimuth angle of the satellite and the due south (hereinafter referred to as angular deviation of the satellite) can be obtained easily. Thus, the orientation of the antenna is directed to the targeted satellite direction by adjusting the direction of the antenna for matching the accurate local standard time and the corrected solar clock time with shifting either the direction reference scale 18 or the light blocking portion 17 in a magnitude corresponding to the angular deviation of satellite, or by adjusting orientation of the antenna for matching the time obtained by a time corresponding to the angular deviation of the satellite to the local standard time and the corrected solar clock time.

Accordingly, in order to adjust the orientation of the antenna utilizing the direction of sun 10 indicated by the light blocking portion 17 and the direction reference scale 18, orientation adjustment is performed with higher accuracy than the method based on the compass and the level without being influenced by offset between the due north and the geomagnetic north, environmental magnetic body or magnetic field generating source.

In addition, since the radio wave from the satellite is not used for adjustment, the shown embodiment of the antenna orientation adjusting method according to the present invention is applicable even when the radio wave from the satellite is not received before the direction of the antenna is adjusted, when a receiving device is not provided, when the receiving device cannot be connected upon installation of the antenna, or so forth.

Furthermore, offset of orientation of the antenna 11 can be visually recognized as offset of the shadow formed by the light blocking portion 17 on the scale 18, namely deviation of the solar clock time or corrected solar clock time. Accordingly, even if deviation is caused up on fixing the orientation of the antenna 11, occurrence of deviation in the orientation of the antenna 11 can be judged as checking the solar clock time or the corrected solar clock time. By this, even during antenna 11 fixation, the reference of the orientation can be provided. Therefore, deviation of orientation of the antenna upon fixing can be monitored to improve workability in adjustment of orientation of the antenna 11.

As set forth above, adjusting the orientation of the satellite antenna 11 can be performed simply and at high precision.

In addition, since the light blocking portion 17 and the scale 18 are provided at the upper end portion of the reflector 12, the shadow formed by light blocking portion 17 is not covered by the shadow of the reflector 12.

Furthermore, the solar clock portion 20 consist of the light blocking portion 16 and the scale 18 is detachable from the reflector 12. Therefore, installation of the antenna 11 is performed in the condition where the light blocking portion 17 and the scale portion 18 are mounted on the reflector 12, and after completion of installation, these light blocking portion 17 and the scale portion 18 can be removed.

Accordingly, in use condition after installation, excellent external appearance can be provided with avoiding the unnecessary solar clock portion consist of the light blocking portion 17 and the scale 18.

It should be noted that the present invention should not be limited to the embodiment set forth above, and following modifications become possible.

Figure 6:
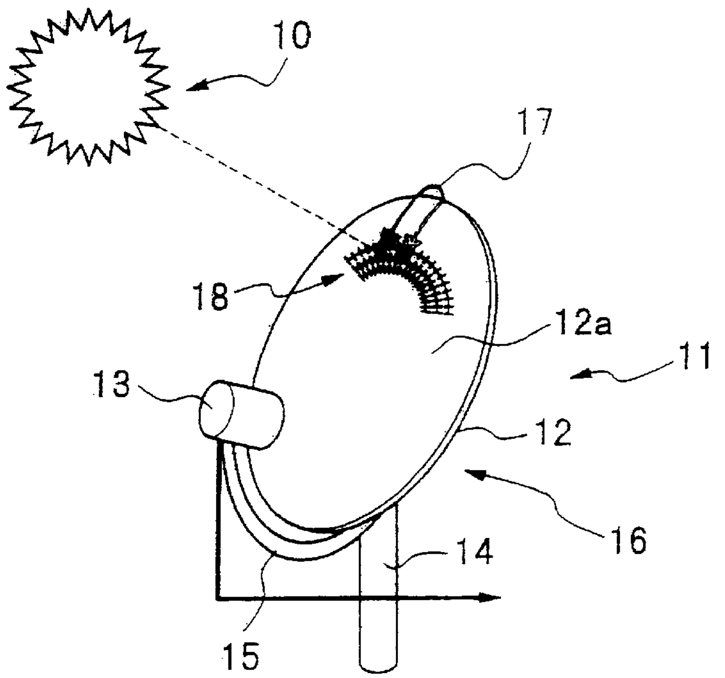
FIG. 6 is a perspective view of a modification of the preferred embodiment of the satellite antenna according to the present invention.

For example, as shown in FIG. 6, the scale 18 for orientation reference is indicated on the upper portion of the reflection surface 12*a* of the reflector 12. Corresponding to this, the light blocking portion 17 forming shadow by the light of the sun 10 may be provided on the side of the upper portion of the reflecting surface 12*a* of the reflector 12.

In this case, since the light blocking portion 17 forming the shadow of the light of the sun 10 and the scale 18 for making judgment of the orientation of the sun by the shadow formed by the light blocking portion 17 are provided on the reflector 12, it becomes possible to determine the direction of the sun 10 with the shadow formed by the light blocking portion 17 on the scale 18 for enabling orientation of the reflector 12 toward the satellite using the direction of the sun 10. Therefore, the shown modification can achieve similar effect as that achieved by the former embodiment.

Furthermore, since the scale 18 is indicated on the reflector 12, it becomes unnecessary to provide the scale panel only by indicating the scale 18 on the reflecting surface.

Figure 7:
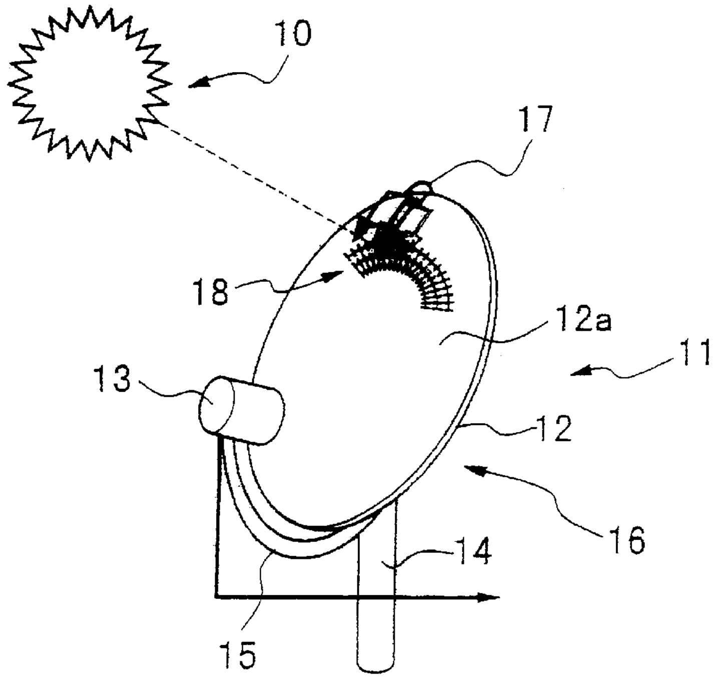
FIG. 7 is a perspective view of the modification of the preferred embodiment of the satellite antenna according to the present invention.
Figure 8:
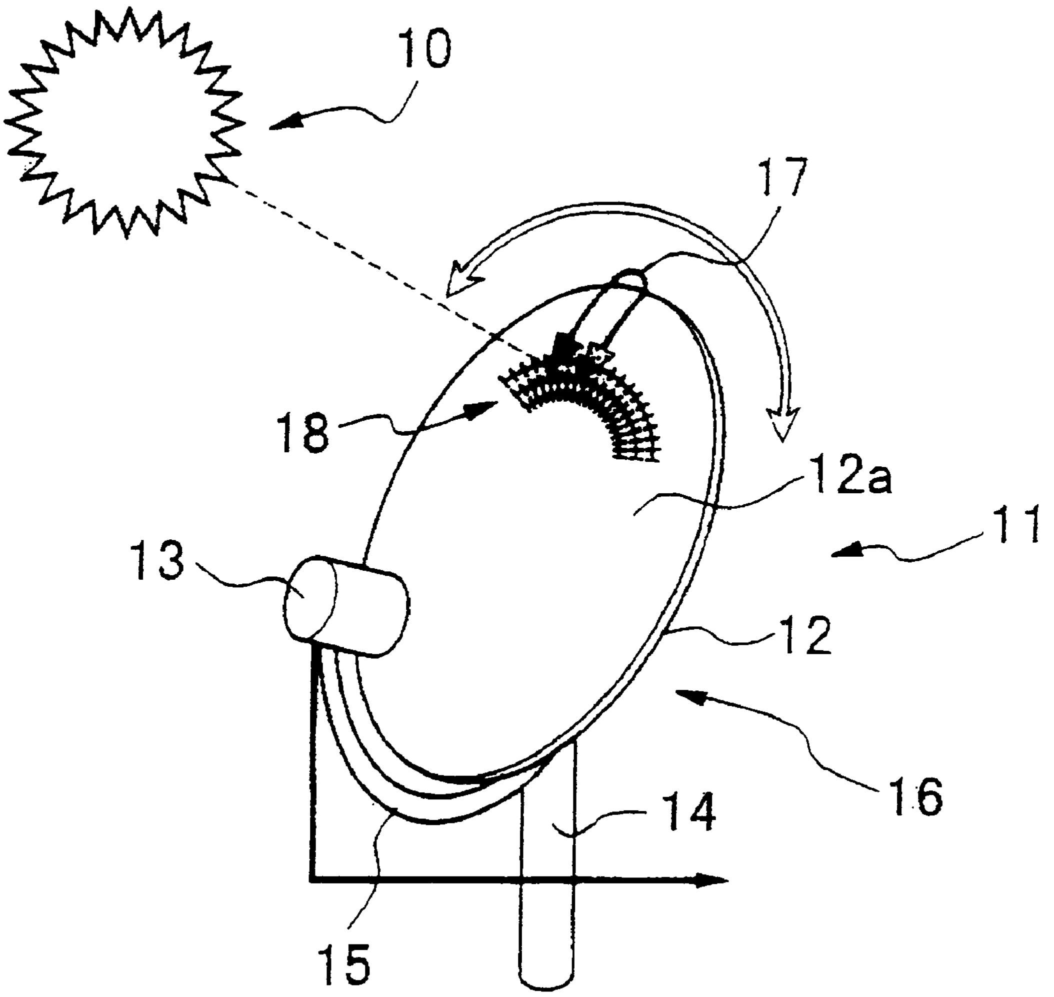
FIG. 8 is a perspective view of the modification of the preferred embodiment of the satellite antenna according to the present invention.

Here, as the light blocking portion 17, simple indication type as shown in FIG. 6, a range designation type generating the width of the shadow corresponding to a given elapsed time as shown in FIG. 7 and a variable indication type which is adjustable of the position relative to the reflector 12 as shown in FIG. 8.

In case of range designation type, since a width of the light blocking portion 17 is provided so that the shown range becomes a given period, such as 30 minutes, 1 hour or so forth, this is particularly effective for the case where time is required for adjustment operation of orientation of the antenna 11.

In case of the variable designation type, by adjusting the position of the light blocking portion 17, it becomes possible to make setting of the installation condition easily seen. Namely, setting of the installation condition can be easily appreciated by establishing correspondence of the parameter varying depending upon the installation condition, such as latitude and longitude of the place where the antenna is installed, day and time to perform installation and so forth.

Figure 9A:
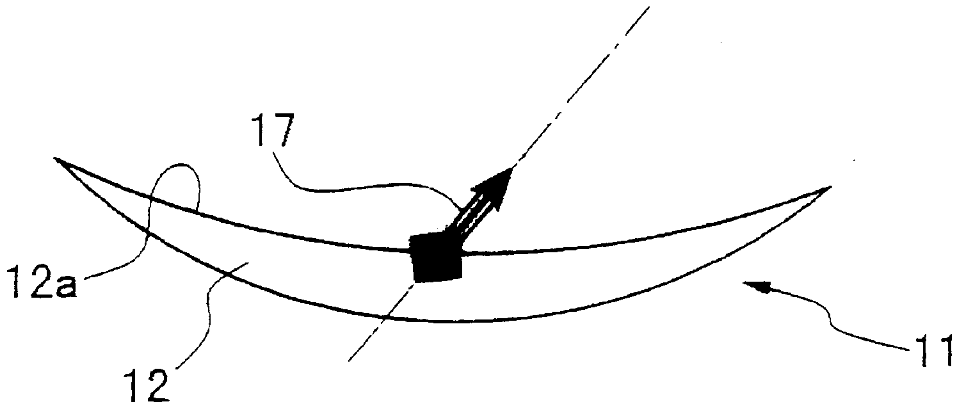
FIGS. 9A and 9B are plane views of another modification of the preferred embodiment of the satellite antenna according to the present invention.
Figure 9B:
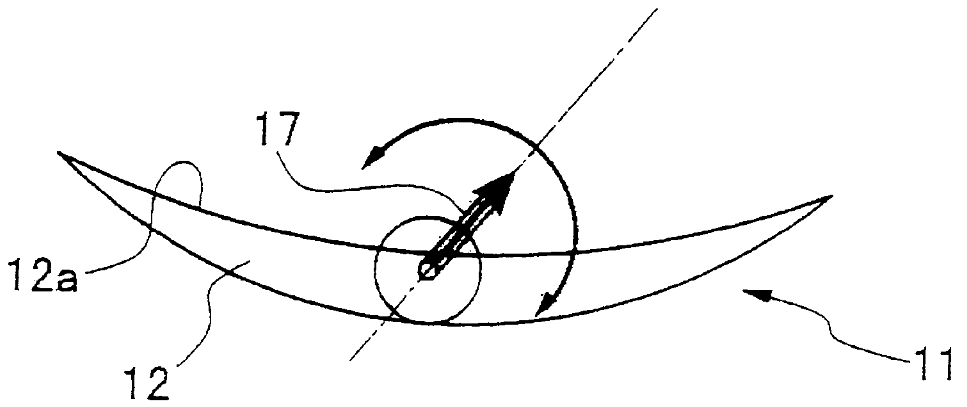

As the light blocking portion 17, it is also possible to use one preliminarily provided an angular difference with respect to the orientation of the reflector 12 on the basis of the longitude of the place where the antenna is installed and the direction of the target satellite, as shown in FIG. 9A, or one adjustable of angle with respect to the reflector mirror 12 so as to modify the longitude of the antenna installation point and the position of the satellite as object for reception, as shown in FIG. 9B.

Figure 10A:
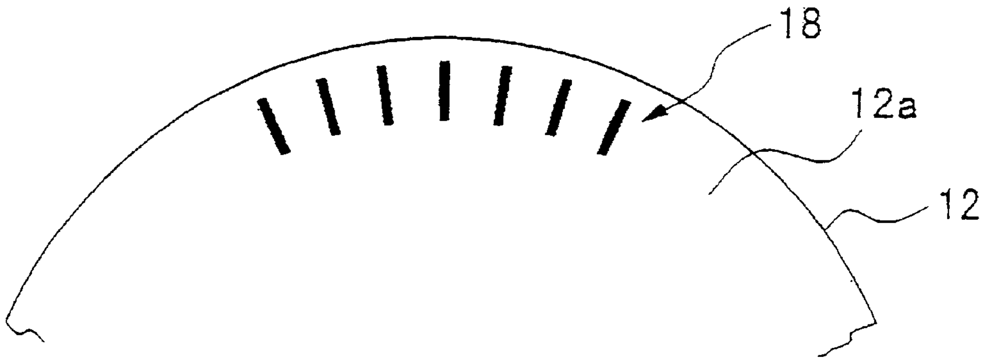
FIGS. 10A to 10D are illustrations showing upper portion of a reflector in another modification of the preferred embodiment of the satellite antenna according to the present invention as viewed from the side of the reflector surface.
Figure 10B:
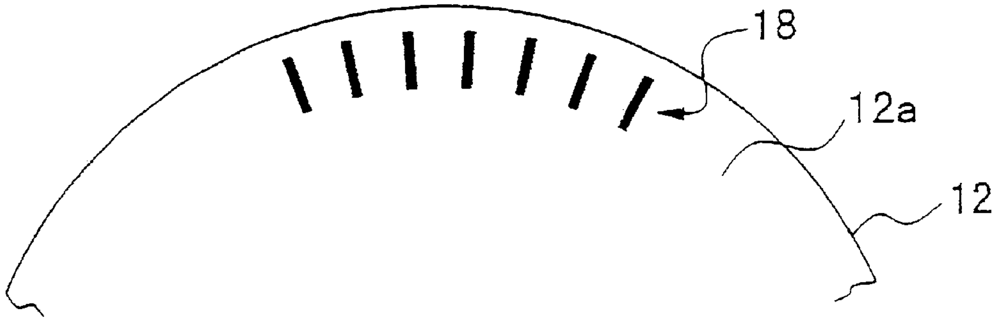
Figure 10C:
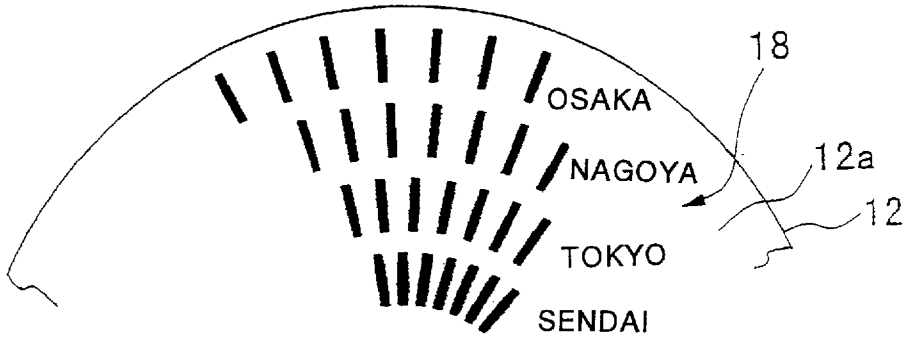
Figure 10D:
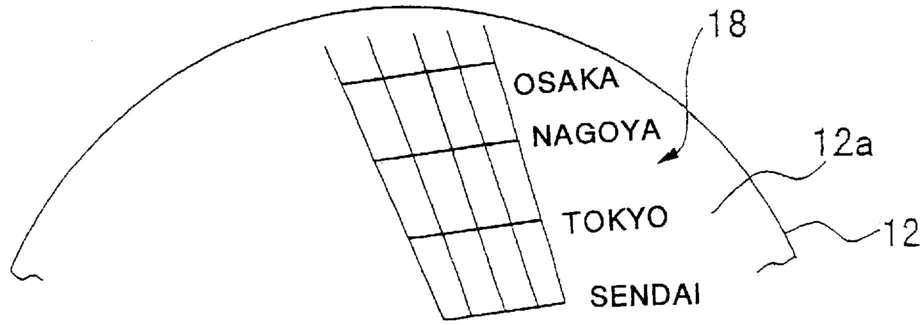

As the orientation reference scale 18 on the reflecting surface 12*a,* the scale 18 with reference to the orientation of the antenna 11 is provided as shown in FIG. 10A (a broken line indicates a line extending vertically through a center line of the reflecting surface 12*a* of the antenna in FIGS. 10A to 10D), the scale 18 indicated with providing an offset on the basis of the latitude of the antenna installation place and direction of the target satellite is provided as shown in FIG. 10B, a plurality of scales respectively adapted to respective places of a plurality of places so as to be adapted for a plurality of places are provided as shown in FIG. 10C, and a scale 18 continuously indicates respective places of FIG. 10C is provided as shown in FIG. 10D.

In the case where the light blocking portion 17 is provided on the side of the upper portion of the reflecting surface 12*a* of the reflector 12, the light blocking portion 17 may be provided detachably with respect to the reflector 12. In this case, installation of the antenna 11 is performed in the condition where the light blocking portion 17 is provided on the reflector 12. The light blocking portion 17 can be removed from the reflector 12 after completion of installation of the antenna 11. In use condition after installation, excellent external appearance can be provided with avoiding the unnecessary solar clock portion consist of the light blocking portion 17 and the scale 18.

It should be noted that while effectiveness of the satellite antenna 11 for installation is limited in the daytime and under fine weather. However, it is frequently instructed in an instruction manual of the satellite antenna that the antenna should be directed in the direction of the sun at 1 or 2 P.M. On the other hand, in case of the antenna 11, in which electric power is supplied to the converter 13, installation operation in the rain may cause an electric shock. Since the installation of the satellite antenna is usually done in the daytime under fine weather, the antenna 11 of the present invention is effective even in normal antenna installation operation.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. An antenna for receiving a satellite broadcast having a reflector for reflecting a radio wave from a satellite on a reflecting surface for convergence and a receiving portion for receiving the radio wave reflected by said reflector, comprising:

a light blocking portion forming a shadow by the sun light; and a scale determining a direction of the sun by the shadow formed by said light blocking portion, the scale having a first clock marking positioned at 180° relative to a second clock marking and in alignment with the reflecting surface of the reflector, said light blocking portion and said scale being provided at an upper end portion of said reflector.

2. An antenna for receiving a satellite broadcast as set forth in claim 1, wherein said light blocking portion and said scale are detachably mounted on said reflector.

3. An antenna for receiving a satellite broadcast as set forth in any one of claim 1, wherein said scale is printed per place of a plurality of places.

4. An antenna for receiving a satellite broadcast as set forth in claim 1, wherein said scale is mounted horizontally on the reflector and said light blocking portion is mounted perpendicularly to the scale.

5. An antenna for receiving a satellite broadcast as set forth in claim 1, wherein said light blocking portion is mounted in a center of the scale.

6. An antenna for receiving a satellite broadcast as set forth in claim 1, wherein said light blocking portion is adjustable of position with respect to said reflector.

7. An antenna for receiving a satellite broadcast as set forth in claim 6, wherein said light blocking portion is adjustable of an angle with respect to said reflector.

8. An antenna for receiving a satellite broadcast as set forth in claim 6, wherein said scale is printed per place of a plurality of places.

9. An antenna for receiving a satellite broadcast as set forth in claim 1, wherein said light blocking portion is adjustable of an angle with respect to said reflector.

10. An antenna for receiving a satellite broadcast as set forth in claim 9, wherein said scale is printed per place of a plurality of places.

11. An antenna for receiving a satellite broadcast having a reflector for reflecting a radio wave from a satellite on a reflecting surface for convergence and a receiving portion for receiving the radio wave reflected by said reflector, comprising:

a light blocking portion forming a shadow by the sun light, said light blocking portion forms a shadow having a width corresponding to an elapsed time; and a scale determining a direction of the sun by the shadow formed by said light blocking portion, said light blocking portion and said scale being provided at an upper end portion of said reflector.

12. An antenna for receiving a satellite broadcast as set forth in claim 11, wherein said scale is printed per place of a plurality of places.

13. An antenna for receiving a satellite broadcast as set forth in claim 11, wherein said light blocking portion is adjustable of an angle with respect to said reflector.

14. An antenna for receiving a satellite broadcast as set forth in claim 11, wherein said scale is printed on said reflector.

15. An antenna for receiving a satellite broadcast as set forth in claim 14, wherein said light blocking portion is adjustable of an angle with respect to said reflector.

16. An antenna for receiving a satellite broadcast as set forth in claim 14, wherein said light blocking portion forms the shadow having a width corresponding to an elapsed time.

17. An antenna for receiving a satellite broadcast as set forth in claim 14, wherein said scale is printed per place of a plurality of places.

18. An antenna for receiving a satellite broadcast as set forth in claim 14, wherein said light blocking portion is adjustable of position with respect to said reflector.

19. An antenna for receiving a satellite broadcast as set forth in claim 18, wherein said light blocking portion is adjustable of an angle with respect to said reflector.

* * * * *